United States Patent
Fuderer et al.

(10) Patent No.: US 6,518,760 B2
(45) Date of Patent: Feb. 11, 2003

(54) MAGNETIC RESONANCE IMAGING METHOD WITH SUB-SAMPLED ACQUISITION

(75) Inventors: Miha Fuderer, Eindhoven (NL); Johan Samuel Van Den Brink, Eindhoven (NL); Michel Paul Jurriaan Jurrissen, Eindhoven (NL); Arianne Margarethe Corinne Van Muiswinkel, Eindhoven (NL); Ulrich Katscher, Norderstedt (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/918,160

(22) Filed: Jul. 30, 2001

(65) Prior Publication Data

US 2002/0039024 A1 Apr. 4, 2002

(30) Foreign Application Priority Data

| Jul. 31, 2000 | (EP) | ............................................. 00202728 |
| Sep. 21, 2000 | (EP) | ............................................. 00203285 |

(51) Int. Cl.⁷ ................................................ G01V 3/00
(52) U.S. Cl. ........................ 324/307; 324/309; 324/318
(58) Field of Search ................................. 324/307, 309, 324/318, 322; 600/421, 422, 410

(56) References Cited

U.S. PATENT DOCUMENTS

| 5,587,656 A | * | 12/1996 | Van Hees-Bergen et al. | 324/307 |
| 5,712,567 A | * | 1/1998 | Wang | 324/307 |
| 5,864,234 A | * | 1/1999 | Ludeke | 324/309 |

FOREIGN PATENT DOCUMENTS

| WO | WO 00/16249 | * | 9/1998 | |
| WO | WO 00/72050 | * | 5/1999 | |
| WO | 9954746 A | | 10/1999 | ....... G01R/33/3414 |
| WO | WO9954746 | | 10/1999 | ....... G01R/33/3415 |
| WO | WO 00/72036 | * | 11/1999 | |
| WO | WO0016249 | | 3/2000 | ............ G06K/9/40 |

OTHER PUBLICATIONS

Pruessmann et al, "Sense: Sensitivity Encoding for Fast MRI" Magnetic Resonance in Medicine, Academic Press, vol. 42, No. 5 Nov. 1999 p. 952–962.

Sodickson et al, "Accelerated Coronary MRA in Volunteers and Patients Using . . . " Proceedings of the International Society for Magnetic Resonance in Med. Scientific Meeting vol. 2, May 22, 1999 p. 1249.

* cited by examiner

Primary Examiner—Edward Lefkowitz
Assistant Examiner—Brij B. Shrivastav
(74) Attorney, Agent, or Firm—John Vodopia

(57) ABSTRACT

A magnetic resonance imaging method employs sub-sampled signal acquisition from a number of receiver coils such as surface coils. A full field-of-view magnetic resonance image is reconstructed on the basis of the sensitivity profiles of the receiver coils, for example on the basis of the SENSE technique. The reconstruction is carried out mathematically as an optimization, for example, requiring a minimum noise level in the magnetic resonance image. According to the invention, a priori information is also involved in the reconstruction and the a priori information is taken into account especially as a constraint in optimization.

8 Claims, 2 Drawing Sheets

MAGNETIC RESONANCE IMAGING METHOD WITH SUB-SAMPLED ACQUISITION

This application claims priority from a European application filed on Jul. 31, 2000 and assigned application Ser. No. 00202728.2 and a European application filed on Sep. 21, 2000 and assigned application Ser. No. 00203285.2, the contents of both applications are incorporated herein by reference.

TECHNICAL DESIGNATION

The invention relates to a magnetic resonance imaging method comprising the steps of
  acquisition of sub-sampled magnetic resonance signals with a system of receiver antennae
    the system of receiver antennae having a spatial sensitivity profile
  reconstruction of a magnetic resonance image on the basis of
    the sub-sampled magnetic resonance signals
    the spatial sensitivity profile and
    a priori image information
  optimization of the reconstruction with respect to a pre-selected aspect of distribution of sampled data included in the sub-sampled magnetic resonance signals over the reconstructed magnetic resonance image.

PRIOR ART DOCUMENT

Such a magnetic resonance imaging method is known from the paper 'SENSE: Sensitivity encoding for fast MR-imaging' in Magnetic Resonance in Medicine 42 (1999) 952.

DISCUSSION OF PRIOR ART

This magnetic resonance imaging method is commonly known as the 'SENSE-method' in the field of MR-imaging. In the known magnetic resonance imaging method the number of phase-encoding steps is reduced so as to reduce the time required for the acquisition of magnetic resonance signals. Consequently, the acquired magnetic resonance signals are built-up as superpositions of contributions from several positions in the scanned volume. The spatial sensitivity profile of the system of receiver antennae is employed to decompose the superposed contributions into signal amplitudes relating to separate positions in the scanned volume. These signal amplitudes represent the brightness values in the magnetic resonance image at full sampling. In other words, part of the spatial encoding of the magnetic resonance signals is performed on the basis of the spatial sensitivity profile. The decomposition of the sub-sampled magnetic resonance signals into signal amplitudes involves a reconstruction matrix which relates the signal amplitudes to the sub-sampled magnetic resonance signals.

The cited reference mentions that different optimizations may be employed in the reconstruction. The so-called strong reconstruction derives the reconstruction matrix from a close approximation to a pre-selected spatial encoding. In particular the strong reconstruction is carried out as a least-squares approximation to a pre-selected set of voxel functions which represent the pre-selected spatial encoding. The so-called weak reconstruction derives the reconstruction matrix from a close approximation to a pre-selected noise distribution in the reconstructed magnetic resonance image.

The known SENSE-method employs a priori knowledge in the reconstruction in that for positions which are outside the object to be examined the pixel-value is set to zero in the reconstructed magnetic resonance image. However, this a priori information is difficult to acquire and the cited reference hardly provides any effective measures to obtain this a priori information. Furthermore, it appears in practice that the this use of a priori information gives rise to artefacts in the reconstructed magnetic resonance image.

OBJECT OF THE INVENTION

An object of the invention is to provide a magnetic resonance imaging method in which artefacts are more effectively avoided in the magnetic resonance image reconstructed from the sub-sampled magnetic resonance signals.

STATEMENT OF THE INVENTION

This object is achieved by the magnetic resonance imaging method according to the invention wherein said a priori information is taken into account as a constraint in said optimization.

DESCRIPTION OF THE INVENTION

The invention is based on the insight that the known method produces artefacts in the form of ugly cut-line effects and that these are effects due to the blunt setting to zero of pixel values without taking into account the unfolding of sub-sampled magnetic resonance signals in the decomposition process. According to the invention the a priori information is taken into account in the optimization as a constraint which is implemented, for example, mathematically while using one or several Lagrange multipliers. This results in more gradual employment of the a priori information in the decomposition or unfolding of the image information in the sub-sampled magnetic resonance signals. A simple optimization procedure consists of a least-squares fit method that is quite reliable and easy to implement.

The a priori information, for example, includes accurate information on the position of the object to be examined with respect to the field-of-view of the magnetic resonance imaging system. Notably the position of the patient's chest wall and its motion due to breathing are taken into account in the a priori information as to for which pixel-positions (almost) zero pixel values are expected. The a priori information may also include information relating to the manner of the acquisition of magnetic resonance signals and effective filter settings from which information on the expected pixel-values can already be derived. The a priori information be may made available in the form of pre-set pixel values for the magnetic resonance image to be reconstructed. The a priori information may also pertain to a local permissible noise level in the reconstructed magnetic resonance image. In another example the a priori information stipulates that pixel values cannot exceed a preset ceiling value.

It is noted that the present invention is advantageously used in conjunction with several different forms of sub-sampling. The time required for the acquisition of the magnetic resonance (MR) signals is reduced by employing sub-sampling of the MR-signals. Such sub-sampling involves a reduction in k-space of the number of sampled points that can be achieved in various ways. Notably, the MR signals are picked-up through signal channels pertaining to several receiver antennae, such as receiver coils that are preferably surface coils. Acquisition through several signal channels enables parallel acquisition of signals so as to achieve a further reduction of the signal acquisition time.

Owing to the sub-sampling, sampled data contain contributions from several positions in the object being imaged.

The magnetic resonance image is reconstructed from the sub-sampled MR-signals while using a sensitivity profile associated with the signal channels. Notably, the sensitivity profile is, for example, the spatial sensitivity profile of the receiver antennae, such as receiver coils. Preferably, surface coils are employed as the receiver antennae. The reconstructed magnetic resonance image may be considered as being composed of a large number of spatial harmonic components which are associated with brightness/contrast variations at respective wavelengths. The resolution of the magnetic resonance image is determined by the smallest wavelength, that is by the highest wavenumber (k-value). The largest wavelength, i.e. the smallest wavenumber, involved, is the size of the field-of-view (FOV) of the magnetic resonance image. The resolution is determined by the ratio of the field-of-view to the number of samples. In the event that the SENSE technique is employed, said ratio is referred to as the SENSE-factor which indicates the degree of sub-sampling.

The sub-sampling may be achieved in that respective receiver antennae acquire MR signals such that their resolution in k-space is coarser than required for the size of the field-of-view of the magnetic resonance image. The smallest wavenumber sampled, i.e. the minimum step-size in k-space, is increased while the largest wavenumber sampled is maintained. Hence, the image resolution remains the same when applying sub-sampling, whereas the minimum k-space step increases, i.e. the field-of-view decreases. The sub-sampling may be achieved by reducing of the sample density in k-space, for example by skipping lines in the scanning of k-space, so that lines in k-space are scanned that are spaced apart further than required for the size of the field-of-view of the magnetic resonance image. The sub-sampling may be achieved by reducing the field-of-view while maintaining the largest k-value so that the number of sampled points is reduced accordingly. Owing to the reduced field-of-view sampled data contain contributions from several positions in the object being imaged.

Notably when receiver coil images are reconstructed from sub-sampled MR-signals from respective receiver coils such receiver coil images contain aliasing artefacts caused by the reduced field-of-view. On the basis of the receiver coil images and the sensitivity profiles the contributions in individual positions of the receiver coil images from different positions in the image are disentangled and the magnetic resonance image is reconstructed. This MR-imaging method is known as such under the acronym SENSE-method. This SENSE-method is discussed in more detail in the international application No. WO 99/54746-A1.

Alternatively, the sub-sampled MR-signals may be combined into combined MR-signals which provide sampling of k-space corresponding to the full field-of-view. In particular, according to the so-called SMASH-method sub-sampled MR-signals approximate low-order spherical harmonics which are combined according to the sensitivity profiles. The SMASH-method is known as such from the international application No. WO 98/21600. Sub-sampling may also be carried-out spatially. In that case the spatial resolution of the MR-signals is less than the resolution of the magnetic resonance image and MR-signals corresponding to full resolution of the magnetic resonance image are formed on the basis of the sensitivity profile. Spatial sub-sampling is achieved in particular in that MR-signals in separate signal channels, e.g. from individual receiver coils, form a combination of contributions from several portions of the object. Such portions are, for example, simultaneously excited slices. Often the MR-signals in each signal channel form linear combinations of contributions from several portions, e.g. slices. This linear combination involves the sensitivity profile associated with the signal channels, i.e. of the receiver coils. Thus, the MR-signals of the respective signal channels and the MR-signals of respective portions (slices) are related by a sensitivity matrix which represents weights of the contribution of several portions of the object in the respective signal channels due to the sensitivity profile. By inversion of the sensitivity matrix, MR-signals pertaining to respective portions of the object are derived. In particular MR-signals from respective slices are derived and magnetic resonance images of these slices are reconstructed.

The magnetic resonance imaging method of the invention is advantageously used for forming a diagnostic magnetic resonance image of a patient to be examined. This results in a high diagnostic quality of the magnetic resonance image which requires only a short acquisition time for picking-up the magnetic resonance signals. Hence, motion of and within the patient to be examined hardly disturbs the magnetic resonance image and rapid changes and dynamics such as a rapidly beating heart can be visualised by way of a rapid series of magnetic resonance images.

Furthermore, as more a priori information is employed in the reconstruction of the magnetic resonance image, a higher degree of sub-sampling can be allowed without substantial aliasing artefacts remaining in the magnetic resonance image. In particular the ratio of the sampling required for the field-of-view to the employed sub-sampling density may be higher than the number of independent surface coils or independent signal channels involved in the acquisition of sub-sampled magnetic resonance signals.

These and other aspects of the invention are further elaborated with reference to the preferred embodiments as defined in the dependent claims.

Preferably, the a priori information used in the reconstruction of the magnetic resonance image is obtained from an explorative magnetic resonance scan. Such an explorative magnetic resonance scan involves the acquisition of magnetic resonance signals prior to the acquisition of the sub-sampled magnetic resonance signals.

Preferably, the a priori information used in the reconstruction of the magnetic resonance image is obtained from an explorative magnetic resonance scan. Such an explorative magnetic resonance scan involves the acquisition of magnetic resonance signals prior to the acquisition of the sub-sampled magnetic resonance signals. The explorative magnetic resonance scan advantageously, acquires magnetic resonance signals that are encoded for positions in a three-dimensional volume. A priori information relating to specific cross-sections through that three-dimensional volume is then derived by multi-planar reformatting. The multi-planar reformatting is, for example, applied to the voxel values of the three-dimensional volume that is reconstructed from the explorative magnetic resonance scan. Hence, the number of required explorative magnetic resonance scans is low, that is, even a single explorative magnetic resonance scan may suffice.

The a priori information is advantageously obtained in various ways. For example, the a priori information can be derived from a previous examination of the same patient, from the setting of a preparatory sequence such as for setting presaturation slabs, from the setting of a spatial excitation profile, etc. In particular the magnetic resonance imaging method may include a scan of k-space where in same portions, such as the peripheral regions, k-space sub-sampling is applied while in other portions, such as a central region around k=0, full sampling of the magnetic resonance signals is applied. The a priori information is then preferably derived from the fully sampled portion of k-space.

The explorative magnetic resonance scan may also be employed to detect the actual spatial sensitivity profile. This is because the explorative magnetic resonance scan includes RF-excitation of spins in the object to be examined. Subsequently, the explorative magnetic resonance signals are generated, for example, as free induction decay signals or as echo signals. The spatial sensitivity profile is calculated from measurement of these explorative magnetic resonance signals. Thus, the same explorative magnetic resonance scan is employed to obtain both the sensitivity profile and the a priori information. Hence, the time required for preparations before the acquisition of the sub-sampled magnetic resonance signals remains quite short.

A magnetic resonance imaging system is often provided with a main receiver coil, such as a so-called quadrature body coil (QBC) which encompasses an examination space and picks-up signals from substantially the entire examination space. The main receiver coil usually encompasses a tunnel-shaped examination space. Furthermore, one or several surface coils are provided. The surface coils have a sensitivity range for magnetic resonance signals that is strongly spatially localized. The surface coils are placed on the patient's body adjacent the region to be imaged.

According to the invention, the explorative magnetic resonance signals are picked-up by both the main receiver coil and by the respective surface coils. The explorative magnetic resonance image is reconstructed from the explorative magnetic resonance signals picked-up by the main receiver coil. Separate coil-images are reconstructed from the magnetic resonance signals from the separate surface coils. The sensitivity profiles are then obtained from the ratios of the brightness values in the coil images to the corresponding brightness values in the explorative magnetic resonance image. It has been found that a particular useful implementation involves interleaved signal acquisition with alternating acquisition of explorative magnetic resonance signals from the respective surface coils and acquisition of explorative magnetic resonance signals from the main coil.

Preferably, the explorative magnetic resonance image is reconstructed from extended magnetic resonance signals which are obtained by interpolation between the explorative magnetic resonance signals picked-up by the main receiver coil. In this implementation the explorative magnetic resonance signals may be acquired with the main receiver coil with a relatively low spatial resolution, i.e. with a low spatial density. This interpolation ensures that the spatial pixel density of the explorative magnetic resonance image equals the pixel density of the magnetic resonance image reconstructed from the sub-sampled magnetic resonance signals on the basis of the spatial sensitivity profiles. Hence, there is no need to for the spatial resolution of the main receiver coil and surface coils to be (approximately) equal. The a priori information taken into account is then represented by the explorative magnetic resonance image and the equal pixel densities enable the optimization to take into account all pixel positions in the reconstructed magnetic resonance image.

The invention also relates to a magnetic resonance imaging system. The magnetic resonance imaging system according to the invention is defined in the independent claim 7. The magnetic resonance imaging system of the invention is suitable for carrying out the magnetic resonance imaging method of the invention. This is achieved in practice by suitably programming a computer or micro-processor which controls the magnetic resonance imaging system.

The invention also relates to a computer program as defined in the independent claim 8. The computer program according to the invention enables the magnetic resonance imaging system to achieve the technical effects involved in performing the magnetic resonance imaging method of the invention. The computer program is loaded in the computer of micro-processor of the magnetic resonance imaging system. The computer program can be provided on a carrier such as a CD-ROM disk. The computer program may also be provided via a network, such as the world-wide web; the computer program can then be downloaded into the memory of the computer of the magnetic resonance imaging system.

PREFERRED EMBODIMENTS

These and other aspects of the invention will be elucidated with reference to the embodiments described hereinafter and with reference to the accompanying drawing.

LIST OF FIGURES

FIG. 1 shows diagrammatically a magnetic resonance imaging system in which the invention is used; and FIG. 2 shows method steps for generating a magnetic resonance image according to the invention.

DESCRIPTION OF FIGURE

The Figure shows diagrammatically a magnetic resonance imaging system in which the invention is used. The magnetic resonance imaging system includes a set of main magnet coils 10 whereby a steady, uniform magnetic field is generated. The main magnet coils are constructed, for example in such a manner that they enclose a tunnel-shaped examination space. The patient to be examined is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21. The gradient coils 11, 12 are energized by application of an electric current by means of the power supply unit 21. The strength, direction and duration of the gradients are controlled by control of the power supply unit. The magnetic resonance imaging system also includes transmission and receiving coils 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that a patient 30 to be examined is enclosed by the body coil 13 when he or she is arranged in the magnetic resonance imaging system. The body coil is preferably designed as a quadrature body coil and functions as the main receiver coil. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is usually used alternately as the transmission coil and the receiving coil. Such a coil is usually referred to as a 'synergy-coil'. Furthermore, the transmission and receiving coil is usually shaped as a coil, but other geometries where the transmission and receiving coil acts as a transmission and receiving antenna for RF electromagnetic signals are also feasible. The transmission and receiving coil 13 is connected to an electronic transmission and receiving circuit 15.

It is to be noted that the magnetic resonance imaging system also provided with several other receiving coils 16. For example, surface coils 16 can be used as receiving coils. Such surface coils have a high sensitivity in a comparatively small volume. The transmission coils, such as the surface coils, are connected to a demodulator 24 and the received magnetic resonance signals (MS) are demodulated by means of the demodulator 24. The demodulated magnetic resonance signals (DMS) are applied to a reconstruction unit. The receiving coil is connected to a preamplifier 23. The preamplifier 23 amplifies the RF resonance signal (MS) received by the receiving coil 16 and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. The reconstruction unit derives one or more image signals from the demodulated magnetic resonance signals (DMS), which image signals represent the image information of the imaged part of the object to be examined. The reconstruction unit 25 in practice is preferably constructed as a digital image processing unit 25 which is programd so as to derive from the demodulated magnetic resonance signals the image signals which represent the image information of the part of the object to be imaged. The signal on the output of the reconstruction unit 25 is applied to a monitor 26, so that the monitor can display the magnetic resonance image. It is alternatively possible to store the signal from the reconstruction unit 25 in a buffer unit 27 while awaiting further processing.

The magnetic resonance imaging system according to the invention is also provided with a control unit 20, for example in the form of a computer which includes a (micro) processor. The control unit 20 controls the execution of the RF excitations and the application of the temporary gradient fields. In particular the control unit controls the acquisition of sub-sampled magnetic resonance signals and the application of the explorative scan so as to generate the a priori information that is used in the optimization of the reconstruction of the magnetic resonance image from the sub-sampled magnetic resonance signals. The reconstruction unit is arranged to take the a priori information into account in the optimized reconstruction of the magnetic resonance image. To this end, the computer program according to the invention is loaded, for example, into the control unit 20 and the reconstruction unit 25.

Figure 1:
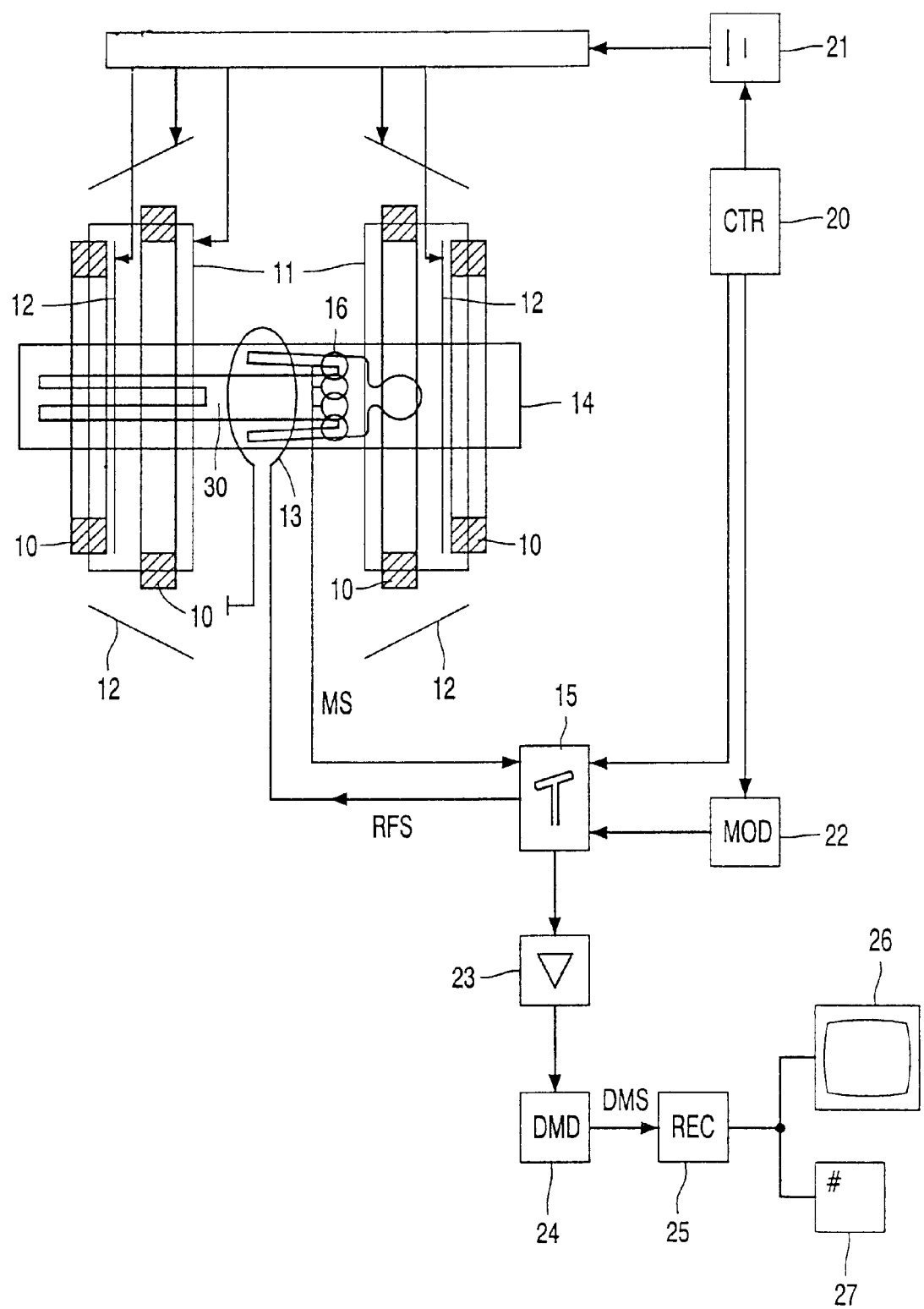
Figure 2:
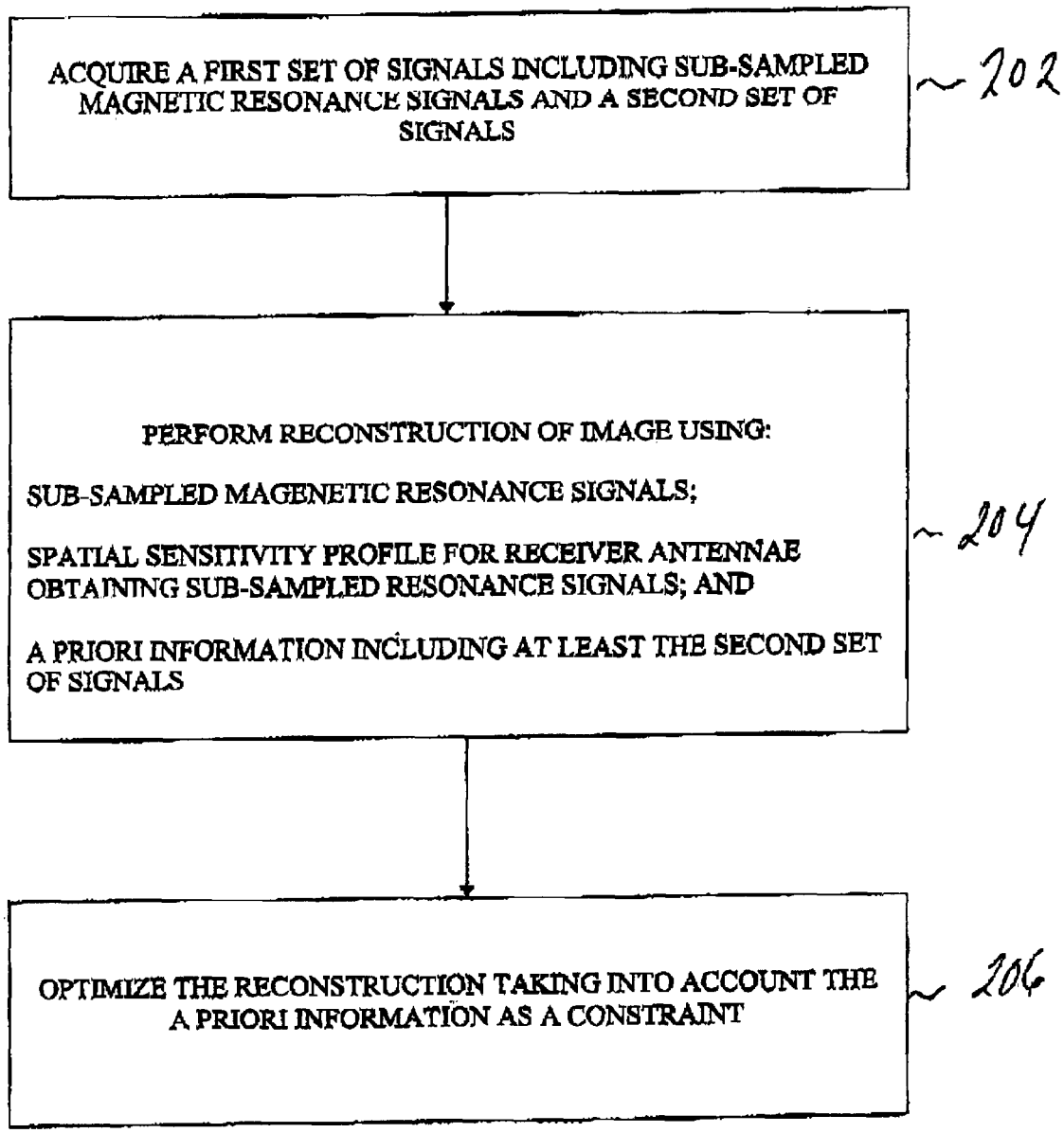

The method steps for providing a magnetic resonance image are shown in FIG. 2. At step 202, a first set of signals including sub-sampled magnetic resonance signals and a second set of signals are acquired. At step 204, image reconstruction is performed using sub-sampled magnetic resonance signals, spatial sensitivity profile for receiver antennae obtaining sub-sampled resonance signals, and a priori information including at least the second set of signals. At step 206, the reconstruction is optimized taking into account the a priori information as a constraint.

The reconstruction according to the invention, employing the SENSE method will now be elaborated in greater detail. The resultant receiver coil images, also referred to as raw images consist of N mutually overlapping strips. Yet, this situation has been measured simultaneously with M coils, whereas M≧N. In fact, the actual measurement is acquired by using a step in k-space that is N times too large compared to the k-space step that Nyquist would prescribe for the regular acquisition at full sampling. The value 3 is a typical value of N, also called SENSE factor, the data thereof is Fourier transformed. In effect, for each pixel of the required image there are M equations and N unknowns, which can be solved as a set of linear equations. This results in the required image according to the SENSE acquisition scheme.

The main problem of this procedure is that locally the set of equations may become poorly conditioned, i.e. almost singular. Since the input data or coil signals always contain noise, the ill-conditioning of the set of equations leads to an enormous increase in noise in the resultant image. In theory, for a location where the set is completely singular, the resultant noise (i.e. the noise in that region of the reconstructed image) becomes infinite. In practice this is observed as ugly "noisy patches" in the SENSE images. An additional problem is the necessity of coil sensitivity maps whose formation is comparatively time-consuming.

In order to speed up the acquisition with a higher accuracy of the reconstructed image, it is now proposed to segment the k-space into regions, that is, in a basic set-up into two regions. The SENSE factor is different for different regions. Notably it is lower for the low spatial frequencies. In the most basic set-up the SENSE-factor equals 1 (i.e. normal acquisition) for the lowest spatial frequencies.

From such an acquisition two subsets can be extracted:

1) Data from a regular SENSE scan, that is, by dropping a number of central lines, the so-called "S-data". A reconstruction according to SENSE would result in a so-called "S-image".

2) Data from a low-spatial frequency scan by dropping all data outside the central region, the so-called "L-data". This data can be reconstructed in a regular manner so as to form a low-resolution image, i.e. an image with a low refreshing rate.

Subject to the condition that the L-data has been acquired with a SENSE-factor=1, that data allows the reconstruction of coil sensitivity maps. This means that a regular SENSE reconstruction of the S-data can be performed, even if no pre-acquired coil-sensitivity data is available. Moreover, the L-data has been acquired with no SENSE factor, or with a moderate SENSE-factor only, for example 1.5. This allows the reconstruction (either by plain FFT or by SENSE) of a low-resolution image, the so-called "L-image", that can be regarded as being stable in terms of signal-to-noise ratio. The basic idea is to use the data from the L-image wherever the S-image would be exceedingly noisy. This procedure can be implemented in different ways.

A first reconstruction set-up, the so-called "hard substitution", reconstructs both an S-image and an L-image and selects the most appropriate one of the two. The reconstruction process will "know" where this has to be done: if D is the determinant of the set of equations to be solved for each pixel of the image. The value of D strongly varies across the entire image, and noise problems are expected in those regions of the S-image where the value of D is very low. On the basis of this knowledge the simplest procedure for the combination of the S-images and the L-images will be that for every pixel of the resultant image the corresponding value of the S-image is selected if D is above a predetermined threshold. Otherwise the corresponding value of the L-image is selected. A slight imperfection of this combination technique may be the adverse visual effect of "cut lines" in the image, that is, lines separating low-noise regions from high-resolution regions, being regions with a high refreshing rate of the image.

A second reconstruction set-up is the so-called "soft combination", which is a variation of the first set-up: the resultant image I is combined by way of the following equation:

$$I=f(D)\cdot L+(1-f(D))\cdot S$$

where $f(D)$ is a function that approaches 1 for low values of determinant D and approaches 0 for high D values. L and S are the values of the L-images and the S-images, respectively.

A third reconstruction method is the so-called "algebraic combination" which can be described as follows: add to the set of equations, that is, the basis of the reconstruction of the S-image, an additional set of equations expressing that the resultant image pixel values are somewhat close to the L-values of the L-image. The basis for the algebraic combination can be explained in matrix calculus as follows:

The regular SENSE reconstruction is consists in essentially in solving the following set of equations:

$$S\cdot \vec{p}=\vec{m}$$

where S is the sensitivity matrix, so $S_{ij}$ is the sensitivity of coil i in pixel position j. It is an M by N matrix, where M is the number of coils, i.e. the number of equations, and N the SENSE-factor or the number of signals folded on to each other, i.e. the number of unknowns. m ("measured value") is a vector of length M: the folded information for every coil; p ("pixel") is a vector or set of N unfolded pixels.

The least-squares inversion of the problem can be formulated as $$\vec{p}=(S^h\cdot \Psi^{-1}\cdot S)^{-1}\cdot S^h\cdot \Psi^{-1}\cdot \vec{m}$$

where "h" stands for Hermitian transposed and $\Psi$ denotes the M×M noise covariance matrix. So far for regular SENSE.

Now we add an additional set of equations:

$$\vec{p}=\vec{m}_L$$

where $\vec{m}_L$ is the corresponding pixel in the L-image.

The combined set of equations can be written as $$\begin{bmatrix} S \\ I_N \end{bmatrix} \cdot \vec{p} = \begin{bmatrix} \vec{m} \\ \vec{m}_L \end{bmatrix}$$

where $I_N$ stands for N×N identity matrix. The solution thereof is given by $$\vec{p}=\left(\begin{bmatrix} S \\ I_N \end{bmatrix} \cdot \Psi_{ext}^{-1} \cdot \begin{bmatrix} S \\ I_N \end{bmatrix}\right)^{-1} \cdot \begin{bmatrix} S \\ I_N \end{bmatrix}^h \cdot \Psi_{ext}^{-1} \cdot \begin{bmatrix} \vec{m} \\ \vec{m}_L \end{bmatrix}$$

The "extended noise covariance matrix $\Psi_{ext}$ has to be defined as $$\Psi_{ext} = \begin{bmatrix} \Psi & 0 \\ 0 & R \end{bmatrix}$$

In this expression R is a diagonal "regularization matrix" of size N×N. The diagonal element $R_{ii}$ thereof has to be filled in as the variance of the expected noise in the image, times a certain factor (which governs the trade-off between "too noisy" and "too much resolution loss").

The solution of the combined set of equations is simplified to $$\vec{p}=(S^h\cdot \Psi\cdot S+R^{-1})^{-1}\cdot (S^h\cdot \Psi^{-1}\cdot \vec{m}+R^{-1}\cdot \vec{m}_L)$$

This is also a kind of a "weighted addition": if the determinant of S dominates over $R^{-1}$ (which is, in effect, some constant), the solution approximates the "regular SENSE" reconstruction $$\vec{p}=(S^h\cdot \Psi^{-1}\cdot S)^{-1}\cdot (S^h\cdot \Psi^{-1}\cdot \vec{m});$$

if the determinant approaches zero, then $$\vec{p}\approx(R^{-1})^{-1}\cdot (R^{-1}\cdot \vec{m}_L)=\vec{m}_L$$

The fourth reconstruction scheme is the so-called "full usage". In this scheme any of the previous reconstruction methods can be combined with the following procedure:

reconstruct a combined SENSE-image according to the above three combination methods, perform an inverse Fourier transformation thereof in the SENSE direction(s), substitute the central part of the data thereof by the corresponding form of the L-data (note that this "hard substitution" can be replaced by a weighing function which, depending on $k_y$, gradually changes from "giving full weight to the L-data" to "giving full weight to the combined SENSE data")

perform a Fourier transformation into the image domain.

A further option for the above-mentioned reconstruction methods is the filtering of the L-data before FFT, by multiplying it with a tapering function, e.g. a Riesz function. In addition the L-data can be used for the reconstruction of the coil-sensitivity maps. In regular SENSE the coil-sensitivity maps are usually derived by comparison of coil element data with a body-coil acquisition. However, according to the above mentioned methods the body-coil data is not or not necessarily available. It has already been proposed to take the root-sum-of-squares (RSSQ) combination of the coil element data instead. Yet, that RSSQ is devoid of phase information, thus differences with respect to pixels of the L-image may be introduced. Therefore it is suggested to take a plain sum of the L-data over the coil elements; this will give a more appropriate result if the plain sum can be taken after a very basic phase correction, for example, correcting L-data of every coil element so as to have zero average phase.

SENSE can also be applied for three-dimensional acquisitions. That can be done by a reduced k-line density in $k_y$ or $k_z$ or both directions, as long as the product of the reduction factors does not exceed the number of coils. For the L-data region of k-space, that is, the region of low spatial frequencies acquired with a low SENSE-factor, in principle all combinations of limitations are possible: limitations thereof in $k_y$ or in $k_z$ or in both directions. The last option is only of interest if there is also a SENSE-reduction in both dimensions. The low SENSE-factor region may then be, for example, square, circular or rectangular. In the case of dynamic scans is may be that it is not strictly necessary to acquire the L-data on every frame: in favourable circumstances that data is only used for rather limited image areas. Therefore, the L-data of "old" time frames, for example, of the first dynamic scan, may also be sufficient for subsequent images.

What is claimed is:

1. A magnetic resonance imaging method comprising the steps of acquisition of a first set of signals including sub-sampled magnetic resonance signals and a second set of signals with a system of receiver antennae the system of receiver antennae having a spatial sensitivity profile reconstruction of a magnetic resonance image on the basis of the sub-sampled magnetic resonance signals the spatial sensitivity profile and a priori image information including at least the second set of signals and optimization of the reconstruction with respect to a preselected aspect of distribution of sampled data included in the sub-sampled magnetic resonance signals over the reconstructed magnetic resonance image, wherein said a priori information is taken into account as a constraint in said optimization.

2. A magnetic resonance imaging method as claimed in claim 1, wherein an explorative scan for the acquisition of explorative magnetic resonance signals including the second set of signals precedes the acquisition of the sub-sampled magnetic resonance signals.

3. A magnetic resonance imaging method as claimed in claim 2, wherein the spatial sensitivity profile of the system of receiver antennae is derived from the explorative scan.

4. A magnetic resonance imaging method as claimed in claim 2, wherein a main receiver coil and several surface coils are employed for receiving magnetic resonance signals, in the explorative scan explorative magnetic resonance signals are acquired with the main receiver coil explorative magnetic resonance signals are acquired with the surface coils, notably the acquisition from the surface coils being interleaved with the acquisition form the main receiver coil, and the spatial sensitivity profile is computed from the explorative magnetic resonance signals acquired with the main receiver coil and magnetic resonance signals acquired with the surface coils.

5. A magnetic resonance imaging method as claimed in claim 4, wherein an explorative magnetic resonance image is reconstructed from the magnetic resonance signals acquired in the explorative scan.

6. A magnetic resonance imaging method as claimed in claim 5, wherein extended magnetic resonance signals are interpolated from the magnetic resonance signals acquired with the main receiver coil and the explorative magnetic resonance image is reconstructed from the extended magnetic resonance signals.

7. A magnetic resonance imaging system arranged to acquire a first set of signals including sub-sampled magnetic resonance signals and a second set of signals with a system of receiver antennae the system of receiver antennae having a spatial sensitivity profile reconstruct a magnetic resonance image on the basis of the sub-sampled magnetic resonance signals the spatial sensitivity profile and a priori image information including at least the second set of signals and optimize the reconstruction with respect to a pre-selected aspect of distribution of sampled data included in the sub-sampled magnetic resonance signals over the reconstructed magnetic resonance image, wherein said a priori information is taken into account as a constraint in said optimization.

8. A computer program comprising instructions to acquire a first set of signals including sub-sampled magnetic resonance signals and a second set of signals with a system of receiver antennae the system of receiver antennae having a spatial sensitivity profile reconstruct a magnetic resonance image on the basis of the sub-sampled magnetic resonance signals the spatial sensitivity profile and a priori image information including at least the second set of signals and optimize the reconstruction with respect to a pre-selected aspect of distribution of sampled data included in the sub-sampled magnetic resonance signals over the reconstructed magnetic resonance image, wherein said a priori information is taken into account as a constraint in said optimization.

* * * * *